United States Patent [19]

Wachi et al.

[11] Patent Number: 4,953,096

[45] Date of Patent: Aug. 28, 1990

[54] TEST METHOD AND APPARATUS FOR DISTRIBUTED SYSTEM

[75] Inventors: Isao Wachi, Hitachi; Kinji Mori, Yokohama; Masayuki Orimo, Kawasaki; Yasuo Suzuki, Ebina; Katsumi Kawano, Fuchu; Minoru Koizumi, Yokohama; Kozo Nakai, Katsuta; Hirokazu Kasashima, Hitachi, all of Japan

[73] Assignee: Hitachi, Ltd., Tokyo, Japan

[21] Appl. No.: 84,693

[22] Filed: Aug. 12, 1987

[30] Foreign Application Priority Data

Aug. 15, 1986 [JP] Japan .................. 61-191842

[51] Int. Cl.$^5$ .................................. G06F 11/22
[52] U.S. Cl. .................................. 364/550; 364/200; 364/264; 364/264.1; 371/19; 371/20.4
[58] Field of Search ............... 364/131, 132, 492, 550, 364/200, 900, 300; 371/16, 22, 37, 19, 20.4

[56] References Cited

U.S. PATENT DOCUMENTS

| | | | |
|---|---|---|---|
| 3,551,659 | 12/1970 | Forsythe | 371/19 |
| 4,204,251 | 5/1980 | Brudevold | 364/200 |
| 4,323,966 | 4/1982 | Whiteside et al. | 371/62 |
| 4,468,734 | 8/1984 | Lanier et al. | 364/200 |
| 4,489,379 | 12/1984 | Langer et al. | 364/200 |
| 4,507,727 | 3/1985 | Magar | 364/200 |
| 4,583,224 | 4/1986 | Ishii et al. | 371/16 |
| 4,589,068 | 5/1986 | Heinen | 371/19 |
| 4,627,055 | 12/1986 | Mori et al. | 371/16 |
| 4,719,626 | 1/1988 | Ogasawara | 371/16 |
| 4,797,885 | 1/1989 | Orimo et al. | 371/20.4 |
| 4,803,683 | 2/1984 | Mori et al. | 371/19 |

OTHER PUBLICATIONS

Lanier et al., "Inhibit Propagation of Messages Containing on Origin Address Parity Error"; IBM Technical Disclosure Bulletin; vol. 26, No. 5 10/83.
Leblanc et al; "Debugging Parallel Programs With Instant Replay"; IEE Transaction on Computers, vol. C-36, No. 4, Apr. 1987.
IBM Technical Disclosure; "Table-Driving Testing"; Jan. 1988.
Schindler; "Software Testing"; Electronic Design, 7/22/82.
Hughes et al; "Breakpoint Design", Computer Design; Nov. 1978.

*Primary Examiner*—Felix D. Gruber
*Assistant Examiner*—Ellis B. Ramirez
*Attorney, Agent, or Firm*—Fay, Sharpe, Beall, Fagan, Minnich & McKee

[57] ABSTRACT

In a distributed system having a plurality of processors connected to a common transmission line, each processor comprises means for registering erroneous programs within the processor, and means for changing modes, so that a program is diagnosed on the basis of a processed result of data accepted from the transmission line and is registered in the erroneous program registration means if it is erroneous, and that the mode change means changes-over the test mode and the on-line mode by reference to the erroneous program registration means and in correspondence with the programs registered in or canceled from the registration means.

15 Claims, 6 Drawing Sheets

TEST METHOD AND APPARATUS FOR DISTRIBUTED SYSTEM

TEST METHOD AND APPARATUS FOR DISTRIBUTED SYSTEM

Cross Reference to Related Application
Japanese Patent application No. 281418/1985

BACKGROUND OF THE INVENTION

1. Field of the Invention

The present invention relates to a test method and apparatus by which a test mode and an on-line mode are changed in a distributed system.

2. Description of the Prior Art

The official gazette of Japanese Patent Application Laid-open No. 146361/1982 discloses a method by which, in a distributed processing system wherein the series of processes of one task are executed in distributed fashion by a plurality of processors connected to a common transmission line, a program for executing each of the series of processes is started when data items necessary for the execution of the program have all been accepted from the transmission line into the own processor. This method permits the respective processors to distributively perform the corresponding ones of the series of processes without the necessity of a management processor for managing the whole system. However, it does not include means for testing an application program developed so as to be set in each processor, by the use of on-line data, and deciding the normality or abnormality thereof in the on-line environment concerned.

Some conventional systems other than the distributed processing system include means for collecting the processed result data of programs. The function of the means, however, is to merely take the logarithm of the data in time series and has been unsatisfactory for analyzing a test start result by the use of the collected results.

Further, in a case where a test has been conducted with on-line data, another subsystem receiving the result of the test might have a process within the own subsystem influenced by the received test result. Accordingly, it needs to be considered that the test is realized with the on-line data without affecting any other part.

Also, a case needs to be considered where a subsystem found normal as the result of the test is desired to be immediately incorporated into the system and then operated.

SUMMARY OF THE INVENTION

An object of the present invention is to provide a test method according to which a test can be conducted without affecting another subsystem even with on-line data during the operation of a system, and besides, a tested subsystem can be immediately incorporated if desired.

The above object of the present invention is accomplished by a distributed system with a plurality of subsystems connected to a common transmission line, in which each of said subsystems comprises means for registering erroneous programs within the corresponding subsystem, and mode change means, so that a program is diagnosed with a processed result of data accepted from said transmission line or data obtained by any other means, that if there is an error, it is registered in the erroneous program registration means, and that said mode change means refers to said erroneous program registration means and changes a test mode and an on-line mode in correspondence with the program registered in or canceled from said registration means.

In the distributed processing system consisting of the plurality of subsystems connected to a network, each of the subsystems receives data through the network or any other means and processes the received data. In the present invention, the subsystem itself having performed the process or any other subsystem diagnoses the result of the process as being normal or abnormal by, for example, checking the correspondence between the contents of input and output data.

Using the diagnostic result of the subsystem itself or that of the other subsystem, the modes can be independently changed so as to establish the on-line mode for the normal result and the test mode for the abnormal result. In addition, when a device which converts on-line data into test data in the test mode is disposed in each subsystem, the processed result of the on-line data can be delivered as the test data in the test mode.

For the above reason, the subsystem can be tested even with the on-line data without affecting any other subsystem during the operation of the system, and when normal, the subsystem can be immediately incorporated into the system.

Whether the processed result is normal or abnormal, can be decided by the comparison of a processing time with a prescribed time (time-over), etc., besides the aforementioned comparison of the contents of the input and output data.

DETAILED DESCRIPTION OF THE PREFERRED EMBODIMENTS

Now, embodiments of the present invention will be described in detail with reference to the drawings.

Figure 3:
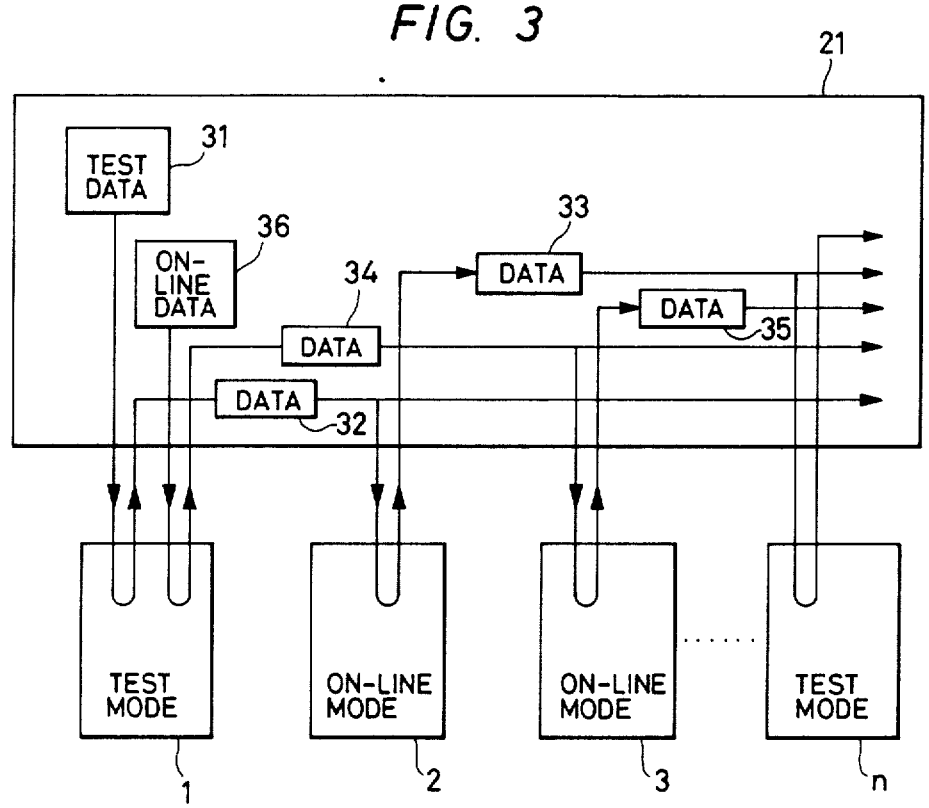
FIG. 3 is a diagram showing the relations of input/output data in respective mode statuses in the distributed processing system embodying the present invention.

FIG. 3 is a diagram showing the relations of input/output data in respective mode statuses in a distributed processing system which is an embodiment of the present invention. In the figure, subsystems 1, 2, . . . and $\underline{n}$ are connected through a network 21. The subsystems 1, 2, . . . and $\underline{n}$ are independent of one another, and they can operate even alone. In addition, each of the subsystems accepts data necessary therefor from among data flowing within the network 21, upon the judgement of its own, and executes a process. Thereafter, it broadcasts a processed result into the network 21.

In FIG. 3, numerals 31-36 indicate data flowing within the network 21, among which the data items 31-35 are test data, and the data item 36 is on-line data.

Figure 4:
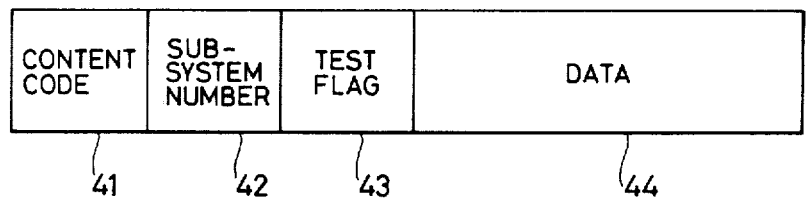
FIG. 4 is a diagram showing the format of data which each subsystem broadcasts into a network.

FIG. 4 shows the format of data which each subsystem broadcasts into the network 21. A content code 41 is a code which specifies the sort of the content of data 44. A subsystem No. at numeral 42 specifies the subsystem having delivered the data. A test flag 43 is a flag which specifies whether or not the data of the format shown in FIG. 4 is test data.

Figure 2:
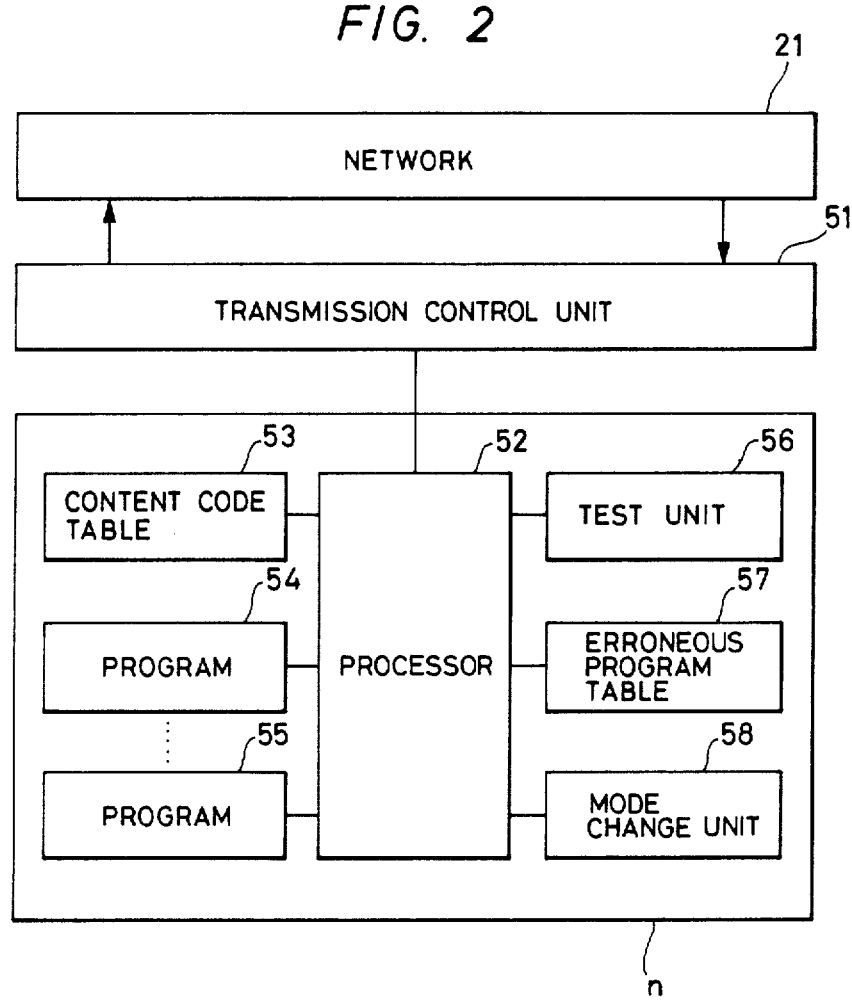
FIG. 2 is a schematic block diagram of the interior of each subsystem of a distributed processing system showing an embodiment of the present invention.

FIG. 2 is a schematic block diagram of the interior of each of the subsystems 1, 2, . . . and n. A transmission control unit 51 performs the transmission control of data flowing within the network 21, and is provided every subsystem. Each subsystem is connected to the network 21 through the transmission control unit 51.

In each subsystem, a plurality of programs 54, . . . and 55 for executing any processes by the use of data accepted from the network 21 are existent in the number of functions required by the corresponding subsystem. Besides, the content codes 41 (refer to FIG. 4) of the data required by these programs are registered in a content code table 53.

In a case where the content code 41 of data flowing within the network 21 is one existing in the content code table 53, a processor 52 accepts into the subsystem the data of the content code registered in the table 53 and delivers the accepted data to a test unit 56.

Next, the processor 52 delivers the data of the content indicated by the content data 41, to the program requiring it. Here, if a flag "1" specifying test data is erect as the test flag 43, the test unit 56 tests the program. In addition, the program, e.g., 54 having received the data executes a process, after the end of which a processed result is returned to the processor 52 along with the content code of the process having been executed by the program 54. The processor 52 having received the processed result in the program 54 delivers it to the test unit 56.

In the test unit 56, there are previously registered the input/output relations of internal codes as stated before, for example, the fact that as regards a content code A, the processed result of data specified by the code A accompanies a content code B without fail.

Upon checking the input/output relations of the content codes, the test unit 56 decides whether or not the process in the program is abnormal, and the result of the decision is delivered to the processor 52. More specifically, all the programs accept the data of predetermined contents and execute predetermined processes for the contents of the accepted data, whereupon they deliver processed results with predetermined content codes appended thereto. The abnormality or error can therefore be found out by checking, for example, the content codes of the input and output. The same applies to a case where a plurality of content codes are concerned.

Figure 6:
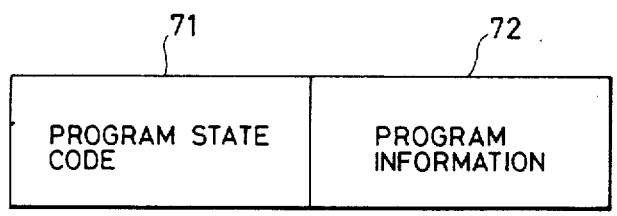
FIG. 6 is a diagram showing an example of the format of the diagnosis of a processed result which is provided from a test unit.

When the test unit 56 has diagnosed the processed result of each program, it delivers a diagnostic result in a format as shown in FIG. 6. Here, a program state code 71 is a code which indicates whether the diagnosed program is normal or abnormal. By way of example, it is "0" for normality and "1" for abnormality.

Program information 72 is the information of the program diagnosed by the test unit 56, and information from which the diagnosed program is known, such as the identifier No. of the program within the subsystem, is recorded. By way of example, if No. "1" is assigned to the program 54 within the subsystem 1, the test unit 56 having diagnosed the processed result of the program 54 records "1" as the program information 72 and produces the diagnostic result of the format in FIG. 6.

Figure 5:
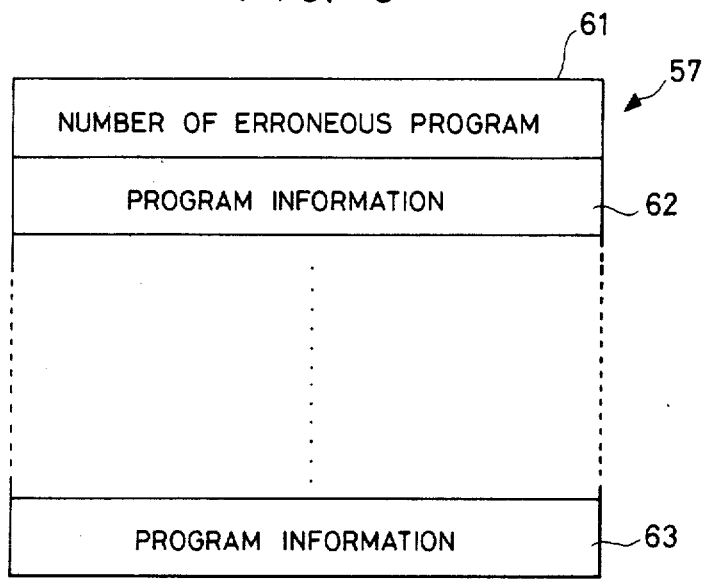
FIG. 5 is a diagram showing an example of arrangement of an erroneous program registration table.

The information of the program diagnosed abnormal or erroneous by the diagnostic result of the test unit 56 is registered in an erroneous program table 57 in a format of FIG. 5 by a mode change unit 58.

Program information items 62, . . . and 63 are codes which specify the erroneous programs within the subsystem, and information items which are similar to the program information 72 elucidated before in connection with FIG. 6 are recorded. These parts are recorded by the mode change unit 58 on the basis of the information of the test unit 56.

When, in case of changing the modes of the subsystem, even one program is registered in the erroneous program table 57, the mode change unit 58 keeps the subsystem in the test mode. Besides, in case of changing the modes of the program, the mode change unit 58 keeps the program registered in the erroneous program table 57, in the test mode.

The mode change unit 58 erects, for example, "1" indicative of test data as the test flag 43 of the data delivered from the subsystem or program in the test mode, whereby the data to be delivered to a transmission line is converted into the test data.

Next, the details of the operation of the present invention will be described with reference to FIG. 3.

Each subsystem views the content code 41 of data flowing within the network 21 and judges whether or not the data is necessary therefor, and it accepts the data if necessary. If a flag indicative of test data, for example, "1"mentioned above is erect as the test flag 43 of the accepted data, the subsystem having accepted the data determines whether or not a test is executed, upon the judgement of its own.

Figure 1:
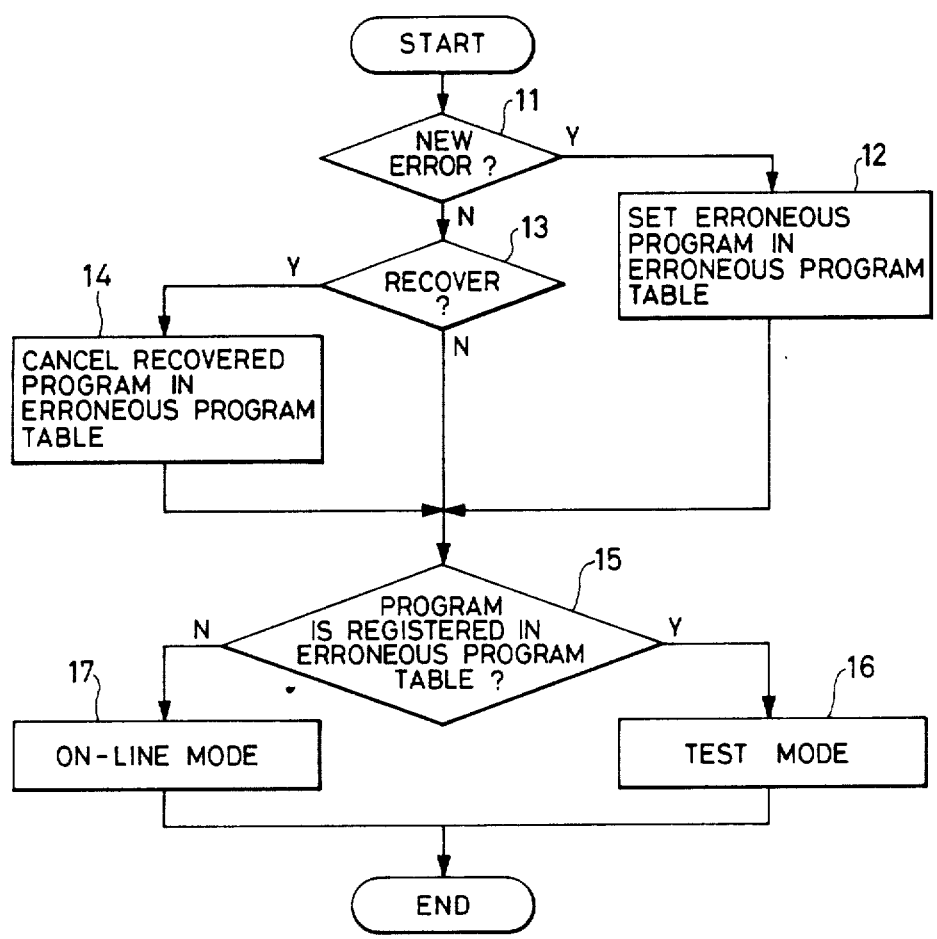
FIG. 1 is a flow chart of a mode changing process showing an embodiment of the present invention.

It is now assumed that, as illustrated in FIG. 3, the subsystems 1 and n be in the test mode, while the subsystems 2 and 3 be in the on-line mode, and the other subsystems shall not be considered for the time being. The mode change of each individual program shall not be considered for the time being, either. The operation of the mode change unit 58 is illustrated in FIG. 1.

(1) Operation ① in Test Mode:

The subsystem 1 in the test mode status is assumed to have two erroneous programs 54 and 55. That is, "54" and "55" are respectively recorded in the columns of program information 62 and 63 of the erroneous program table 57.

It is also assumed that the content code 41 of the test data 31 indicate the content of data which the program 54 ought to accept, and that the content code 41 of the on-line data 36 indicate the content of data which the program 55 ought to accept.

The program 54 having accepted the test data 31 executes a process, and thereafter delivers a processed result with a content code appended thereto. The test unit 56 receives and diagnoses the processed result. It is now assumed that the program 54 have recovered into the normal state and deliver a normal processed result.

Upon receiving the processed result from the program 54, the test unit 56 diagnoses whether the result is normal or abnormal, on the basis of the aforementioned relationship of the input/output content codes by way of example. Since the program 54 has recovered into the normal state, the test unit 56 judges the processed result of the program 54 to be normal or errorless.

Subsequently, the test unit 56 refers to the erroneous program table 57 and examines if the program 54 was registered as an erroneous one. Since the program 54 was abnormal till the last process, the test unit 56 finds out that the program 54 was registered in the erroneous program table 57. The test unit 56 recognizes the recovery of the program 54 into the normality on the basis of the facts that the processed result of the program 54 is errorless and that the program 54 was abnormal till the last process.

The test unit 56 delivers the information that the program 54 has recovered, by recording, for example, "2" indicative of the recovery in the program state code column 71 and "54" in the program information column 72 in the format of FIG. 6.

When the mode change unit 58 receives the above information that the program 54 has recovered, the process of changing the modes is carried out by the flow shown in FIG. 1.

More specifically, the information which the mode change unit 58 has received is the information that the program 54 has recovered (step 13), so that the registration of the program 54 is canceled in the erroneous program table 57 (step 14).

Since the program 55 is recorded in the erroneous program table 57, the mode change unit 58 keeps the subsystem 1 still in the test mode without changing the modes (steps 15, 16).

Since the subsystem 1 is left intact in the test mode, the data 32 to be provided from this subsystem 1 has "1" recorded as the subsystem No. 42 and "1" recorded as the test flag 43. Thus, the data 32 is clearly indicated to be test data delivered from the subsystem 1.

(2) Operation ② in Test Mode:

Next, it is assumed that the on-line data 36 have been accepted into the subsystem 1.

The program 55 of the subsystem 1 having accepted the on-line data 36 is assumed to remain erroneous. The test unit 56 having received the processed result of the program 55 diagnoses this program as being erroneous. Subsequently, it refers to the erroneous program table 57 and checks whether or not the program has already been registered as an erroneous one. Since the program 55 has been registered as the erroneous one in the erroneous program table 57, the test unit 56 recognizes the error of the program 55 as an existing error, and it delivers the information that the error of the program 55 is the existing one, by recording, for example, "3" in the program state code column 71 and "55" in the program information column 72 in accordance with the format of FIG. 6.

The mode change unit 58 having received the information to the effect that the program 55 has the existing error, executes the changing process in accordance with the aforementioned processing flow of FIG. 1. More specifically, on the basis of the information that the program 55 has the existing error, the mode change unit 58 does not register this program in the erroneous program table 57 anew (steps 11, 13, 15) and leaves the subsystem 1 intact in the test mode (step 16).

Accordingly, "1" is recorded as the subsystem No. 42 of the data 34, and "1" as the test flag 43.

(3) Operation ③ in Test Mode:

Next, let's consider a case where the program 55 within the subsystem 1 has recovered into the normal state.

In the subsystem 1 having accepted the on-line data 36, the same process as in the case of the erroneous program 55 is executed That is, the test unit 56 diagnoses the processed result of the program 55, and it decides whether the program 55 is normal, has recovered, has the existing error or has a new error, on the basis of the result of the diagnosis and the result of an inquiry into the erroneous program table 57.

Here, the program 55 has turned from the abnormal state into the normal state. Therefore, the test unit 56 decides that the program 55 has recovered, and it delivers the information of the recovery in the format of FIG. 6.

The mode change unit 58 having received the recovery information cancels the information of the program 55 from the erroneous program table 57 (steps 13, 14).

Assuming that also the program 54 have already recovered as described before, any program is not registered in the erroneous program table 57 now. Therefore, the mode change unit 58 performs the change to the on-line mode (steps 15, 17).

Thus, the processed result 34 of the on-line data 36 has the test flag 43 made "0" this time and is delivered as on-line data. Therefore, also the processed result 35 of the subsystem 3 having received the data 34 is delivered as on-line data.

(4) Operation ① in On-Line Mode:

Next, it is assumed that the program 54 within the subsystem 2 in the on-line mode status have become erroneous.

It is now assumed that data 32 be on-line data, and that a program to execute a process by the use of the data 32 be the program 54 of the subsystem 2.

The program 54 receives the data 32 and executes the process, the result of which is diagnosed by the test unit 56. Here, the program 54 is erroneous, so that the test unit 56 decides the processed result of the program 54 as being erroneous.

Subsequently, the test unit 56 refers to the erroneous program table 57. On this occasion, the subsystem 2 was in the on-line mode till the last process, so that no program is recorded in the erroneous program table 57.

Since the erroneous program table 57 contains no record, the test unit 56 diagnoses the error of the program 54 as being a new error, and it delivers the result of the diagnosis by recording, for example, "4" in the program state code column 71 and "54" in the program information column 72 in accordance with the format of FIG. 6.

The mode change unit 58 having received this output from the test unit 56, executes a process in accordance with the flow shown in FIG. 1. That is, it decides that the program has the new error (step 11) and registers the erroneous program 54 in the erroneous program table 57 (step 12).

Since the erroneous program is registered in the erroneous program table 57 (step 15), the mode change unit 58 executes the change to the test mode (step 16).

Since the subsystem 2 has been changed to the test mode, the processed result 33 of the data 32 has the test flag 43 set to "1" indicative of the test data.

Thenceforth, owing to a similar process, each subsystem changes the on-line mode and the test mode upon the judgement of its own each time test data or on-line data arrives.

There will now be explained the mode change in the case where the present system is expanded during the operation thereof by, for example, the addition of a new subsystem.

When the system has been expanded during the operation thereof by adding new subsystems or by adding new programs to any existing subsystems, the expanded portions are regarded as erroneous programs, and all of them are registered in the erroneous program table 57 stated before.

Subsequently, using test data and on-line data, tests are conducted in the same way as in the foregoing embodiment. When all the programs have become errorless, the system is changed to the on-line mode, and the expanded portions can be operated in the on-line status.

In the above embodiments, there has been described the method which changes the subsystem itself between the test mode and the on-line mode. The mode change of the individual program can be effected by a method similar to the method for the subsystem.

Simple examples therefor will be described below.

Now, let's consider only the mode change of the program 54. Let it be assumed that the program 54 have been set in the subsystem anew.

On this occasion, the information of the program 54 is recorded in the same form as in the foregoing in the erroneous program table 57.

It is supposed that the program 54 have been started with on-line data and that the processed result thereof have been diagnosed by the test unit 56. At this time, it is supposed that the test unit 56 have diagnosed the processed result of the program 54 as being erroneous. The method of the diagnosis, the diagnosing process of the test unit 56 such as the output of the diagnostic result, and the process of the mode change unit 58 can be implemented by the same methods as in the foregoing embodiments.

Now that the processed result of the program 54 has been decided erroneous by the test unit 56, the information of the program 54 remains recorded in the erroneous program table 57. As regards the processed result of the program 54 registered in the erroneous program table 57, the mode change unit 58 erects a flag "1" indicative of test data as the test flag 43.

Thus, until the processed result of the program 54 is diagnosed as being errorless or having recovered by the test unit 56, the mode change unit 58 erects the flag "1" indicative of the test data as the test flag 43 when it delivers the diagnosed processed result to the network 21.

In the present embodiment, the program 54 remains registered in the erroneous program table 57 and is therefore put into the test mode by the mode change unit 58.

Subsequently, the program 54 is assumed to be subjected to a recovery process such as reloading. It is assumed that the program 54 have been turned from the erroneous state into the errorless state by the recovery process.

Now, when the program 54 is started with on-line data, the test unit 56 diagnoses the program 54 as having recovered because this program has become errorless, and it provides the result of the diagnosis. Upon receiving the diagnostic result, the mode change unit 58 deletes the registration of the program 54 from the erroneous program table 57 and puts this program 54 into the on-line mode. That is, the test flag 43 is set to "0" this time, and the processed result of the program 54 is delivered as on-line data.

In this manner, the change of the modes in individual program unit can be performed by the same method as that of the change of the modes for each subsystem.

Further, if the number of successive operations in which each program is regarded as being errorless is registered in the mode change unit 58, the program or the subsystem itself can be held in the test mode for the registered number of times. By way of example, in a case where the mode change unit 58 is so set as to deem each program to be errorless when the program has operated five times in succession, and to change the modes, the subsystem is held in the test mode unless each of all the programs included in the subsystem operates normally five times. On the other hand, in the case of changing the modes of the individual program, unless each individual program operates normally five times, the program not having operated five times is left intact in the test mode.

Further, although in the foregoing embodiments the program has been diagnosed by the test unit 56 within the corresponding subsystem, the modes can be changed on the basis of the diagnostic result of a different subsystem.

Figure 7:
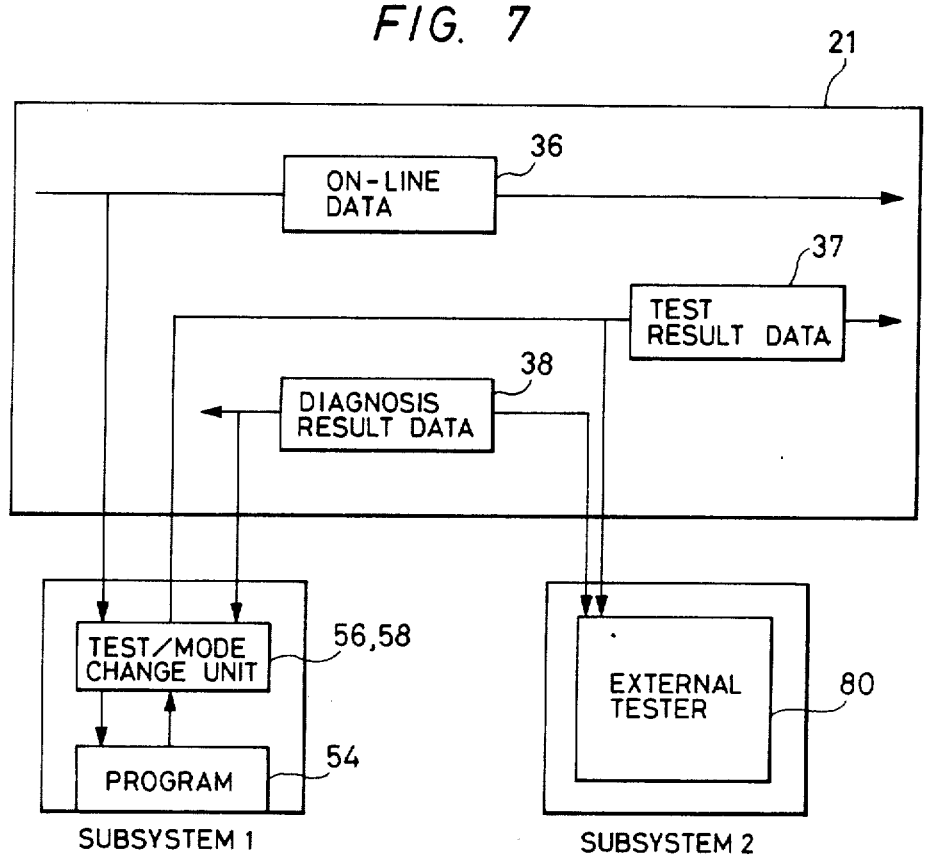
FIG. 7 is an arrangement diagram of another embodiment of the present invention.

A simple embodiment therefor will be described below with reference to FIG. 7.

Now, only the mode change of the program 54 will be considered as in the foregoing. It is assumed that the function of diagnosing the processed results of the respective programs, namely, an external tester 80 be provided within the subsystem 2. Further, for the sake of brevity, the test unit 56 and the mode change unit 58 are collectively illustrated in FIG. 7.

When the program 54 is set in the subsystem 1 anew, the information of this program is recorded in the same form as in the foregoing in the erroneous program table 57.

Figure 8:
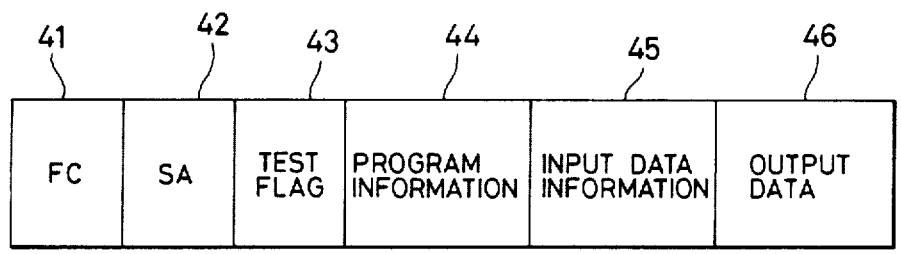
FIGS. 8 and 9 are format diagrams of the output of a test unit and the output of a diagnostic result in FIG. 7.

It is assumed that the program 54 have been started for a test with on-line data or test data (36 in FIG. 7), and that the test unit 56 have received the processed result of the test. On this occasion, the test unit delivers test result data 37 as shown in FIG. 8. Program information 44 is the information of the program having been started for the test. Input data information 45 indicates the data which was used for the start. Output data 46 is the processed result after the test start.

Figure 9:
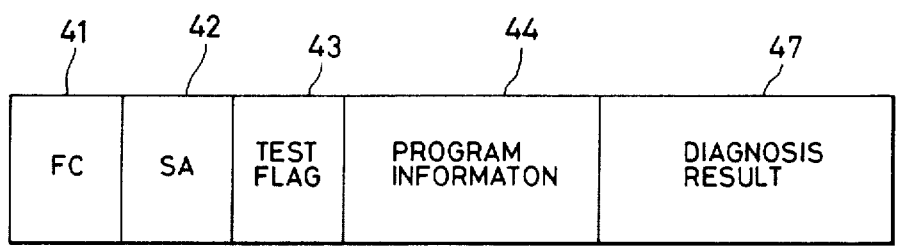

The external tester 80 having the diagnosing function within the subsystem 2 which has received this result, diagnoses it on the basis of the input data information 45, the output data 46 and the program information 44, and provides diagnostic result data 38 in a format shown in FIG. 9.

Program information 44 is information which specifies the program diagnosed. Whether or not the diagnosed program is errorless, is recorded in a diagnostic result 47.

The test unit 56 within the subsystem 1 having received the diagnostic result 38 recognizes the program which has afforded the diagnostic result, owing to the program information 44. In case of the present embodiment, the diagnostic result is recognized to be of the program 54. Subsequently, the test unit 56 delivers a diagnostic result in the format of FIG. 6 by the use of the diagnostic result 47 and through quite the same process as in the foregoing. Thenceforth, the modes are changed by quite the same process as in the foregoing embodiments.

In the present embodiment, the mode change from the test mode to the on-line mode has been mentioned as an example. However, the modes can be conversely changed in quite the same way as in the above embodiment if the test unit 56 provides a processed result based on on-line or test data in the format of FIG. 8.

The mode change of each subsystem can also be performed in quite the same way as in the above embodiment.

Meanwhile, the embodiments of the present invention have been exemplified as accepting the testing data from the transmission line. The testing data, however, can also be obtained by another expedient, for example, a measure in which each subsystem is furnished with a file storing test data. Even with such data, the modes can be changed quite similarly.

In the test mode, it is not always necessary to deliver test data into the transmission line.

The test unit 56, the mode change unit 58 and the external tester 80 may well be constructed of separate processors such as microcomputers which are adapted to realize the functions stated before. It is also possible to unify the processors into the processor 52 in which the functions are realized, without disposing the separate processors.

As stated above, according to the embodiments, in the distributed system which consists of the subsystems connected by the network, each subsystem can change-over the test mode and the on-line mode upon the judgement of its own. Owing to the change-over, even when a test is conducted with on-line data, the result of the test is entirely delivered as test data as long as the subsystem is in the test mode, so that no influence is exerted on another subsystem. Moreover, when an expanded portion is held in the test mode at the time of, e.g., the expansion of the system, it can be tested in the operating condition of the system without exerting any influence on the other subsystems.

As described above, according to the present invention, in a system having a plurality of subsystems connected to a common transmission line, each subsystem is equipped therein with erroneous program registration means and mode change means, so that a program is diagnosed on the basis of the processed result of data accepted from the transmission line or data obtained by another means and is registered in the erroneous program registration means if it is erroneous, and that the mode change means changes-over a test mode and an on-line mode by reference to the erroneous program registration means and in correspondence with programs registered in or canceled from the registration means. Therefore, the invention achieves the remarkable effects that during the operation of the system, a test can be conducted even with on-line data without affecting another subsystem, and that the immediate incorporation of a program etc. into the subsystem is permitted as desired.

What is claimed is:

1. A method for testing a program in a distributed system wherein a plurality of subsystems for processing functions have respective processors connected to one another through a transmission medium comprising:
    a first step of processing a function in each of said subsystems by the use of at least one of data received from said transmission medium and data in the subsystem;
    a second step of diagnosing the processing of the function on the basis of a result of the processing by said first step in each subsystem; and,
    a third step of selectively making a processing mode of its own subsystem to one of a processing mode and a test mode in accordance with the step of diagnosing.

2. A test method according to claim 1 wherein said function is a program to be processed in a subsystem.

3. A test method according to claim 1, further comprising the step of registering, in each subsystem, an erroneous function of said each subsystem in a registration means on the basis of a diagnostic result in another subsystem.

4. A test method according to claim 1 which further includes a fourth step of registering the function diagnosed as being erroneous.

5. A test method according to claim 1, wherein the data which is transmitted on said transmission medium includes a portion for specifying test data, and a content code indicating a content of said data.

6. A test method according to claim 5, wherein the diagnosing step includes the step of diagnosing the function on the basis of a relationship between the content code of the data to be processed in accordance with said function and the content code of the data of the processed result.

7. A test method according to claim 1 or claim 2, further comprising the step of sending, in each subsystem, at least either of data of said own subsystem having the function diagnosed as being erroneous or data of the processed result of the function diagnosed as being erroneous to said transmission medium as test data when said each subsystem is in said test mode.

8. An apparatus for testing a program in a distributed system wherein a plurality of subsystems for processing functions are connected to one another through a transmission medium, wherein each subsystem comprises:
    a first means for function processing by the use of data received from said transmission medium and data in its own subsystem;
    a second means for diagnosing the processing of the function on the basis of a result of the process by said first means; and,
    a third means for selectively making a processing mode of its own subsystem to one of a processing mode and a test mode in accordance with a diagnosis of the second means for diagnosing.

9. A test apparatus according to claim 8, wherein said each subsystem further comprises means for registering an erroneous function in said registration means on the basis of a diagnostic result in another subsystem.

10. The apparatus according to claim 8, wherein each subsystem further comprises means for sending at least either of data of said own subsystem having the function diagnosed as being erroneous or data of the processed result of the function diagnosed as being erroneous to said transmission medium as test data when each subsystem is in said test mode.

11. A test apparatus according to claim 8 wherein said function is a program to be processed in a subsystem.

12. A test apparatus according to claim 8 which further includes means of registering the function diagnosed as being erroneous.

13. A test apparatus according to claim 8, wherein the data which is transmitted on said transmission medium includes a portion for specifying test data, and a content code indicating a content of said data.

14. A test apparatus according to claim 13, wherein the diagnosis means includes means for diagnosing the function on the basis of a relationship between the content code of the data to be processed in accordance with said function and the content code of the data of the processed result.

15. A method for testing a program in a system for processing a plurality of programs, the system having a plurality of subsystems, each subsystem comprising:

a first step of processing, in each subsystem, a program by the use of data in the system;

a second step of diagnosing, in each subsystem, a program on the basis of the result of the processing by said first step; and, a third step of selectively making, in each subsystem, a program to one of a processing mode and a test mode in accordance with the step of diagnosing.

* * * * *